United States Patent
Yasui et al.

(10) Patent No.: US 7,510,780 B2
(45) Date of Patent: Mar. 31, 2009

(54) STRUCTURED MATERIAL, MAGNETIC RECORDING MEDIUM UTILIZING THE SAME, AND MAGNETIC RECORDING/REPRODUCING APPARATUS

(75) Inventors: Nobuhiro Yasui, Kawasaki (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 634 days.

(21) Appl. No.: 10/532,232

(22) PCT Filed: Oct. 22, 2003

(86) PCT No.: PCT/JP03/13471
§ 371 (c)(1),
(2), (4) Date: Apr. 22, 2005

(87) PCT Pub. No.: WO2004/038702
PCT Pub. Date: May 6, 2004

(65) Prior Publication Data
US 2006/0040118 A1 Feb. 23, 2006

(30) Foreign Application Priority Data
Oct. 23, 2002 (JP) .............................. 2002-308367

(51) Int. Cl.
*C25D 5/26* (2006.01)
(52) U.S. Cl. ...................... 428/668; 428/702
(58) Field of Classification Search ........................ None
See application file for complete search history.

(56) References Cited

U.S. PATENT DOCUMENTS

| | | | | |
|---|---|---|---|---|
| 6,248,416 B1 | | 6/2001 | Lambeth et al. | 428/653 |
| 6,562,453 B1 | * | 5/2003 | Futamoto et al. | 428/332 |
| 6,916,557 B2 | * | 7/2005 | Hirayama et al. | 428/832.2 |
| 7,108,926 B2 | * | 9/2006 | Lee | 428/831 |
| 2002/0048696 A1 | | 4/2002 | Kukino et al. | 428/698 |
| 2002/0086186 A1 | | 7/2002 | Lee | 428/694 |

FOREIGN PATENT DOCUMENTS

| | | |
|---|---|---|
| EP | 1186580 | 3/2002 |
| JP | 20001/23140 | 1/2001 |
| WO | WO 99/24973 | 5/1999 |

OTHER PUBLICATIONS

Sato, et al., "Co-Cr-Ta Perpendicular ... Using Pt Seed Layer", IEEE Trans. on Magnetics, vol. 36, No. 5, pp. 2387-2389 (Sep. 2000).

Ariake et al., "Pt and Pd Intermediate Layers ... magnetic recording media", J. of Magnetism and Magnetic Materials, 242-245 (2002) 311-316.

Iijima, et al.; "Preparation of c-axis oriented $PbTiO_3$ thin films and their crystallographic, dielectric, and pyroelectric properties"; J. Appl. Phys. vol. 60, No. 1, pp. 361-367 (1986).

* cited by examiner

*Primary Examiner*—Holly Rickman
(74) *Attorney, Agent, or Firm*—Fitzpatrick, Cella, Harper & Scinto

(57) ABSTRACT

The invention provides a structured material composed by including a noble metal, in which an oriented layer is formed on a layer containing a Group 4A metal. The invention enables to form an oriented layer, which has required a high temperature for formation, by a low temperature process.

4 Claims, 3 Drawing Sheets

STRUCTURED MATERIAL, MAGNETIC RECORDING MEDIUM UTILIZING THE SAME, AND MAGNETIC RECORDING/REPRODUCING APPARATUS

TECHNICAL FIELD

The present invention relates to a structured material having an oriented layer, which is more specifically adapted for use for example in a vertical magnetic recording medium or the like.

BACKGROUND ART

An oriented film of a noble metal is currently attracting attention, for controlling an orientation of a recording layer in a vertical magnetic recording medium for the next generation, or as an electrode layer or an undercoat layer for controlling an orientation of a ferroelectric oxide in a ferroelectride oxide device. In particular, a (001) oriented layer of Pt, Pd or Ir is considered important.

However, it is already known that a thin film of such noble metals tends to show the (111) orientation in a sputtering method usually executed at the room temperature and in the argon atmosphere, regardless of the substrate material. Consequently it is difficult to easily obtain a (001) oriented film of a noble metal.

There have been found several ways to obtain a (001) oriented noble metal film. A non-patent reference 1 (Kenji Iijima et al., J. Appl. Phys., 60(1), p. 361, 1 Jul. 1986) describes that a Pt (001) oriented film can be obtained on a MgO (001) substrate by elevating the substrate temperature to 600° C. and adding oxygen by 50% in an argon gas used as a sputtering gas.

However, the aforementioned technology relating to the oriented film requires to elevate the substrate temperature in the manufacturing process. Therefore the present invention provides a novel oriented film and a prodution method thereof, not requiring a high temperature of the substrate.

DISCLOSURE OF THE INVENTION

The present invention provides a structured material composed by including a noble metal, comprising an oriented film provided on a layer containing a Group 4A metal.

The present invention also provides a magnetic recording medium including, on a substrate and in order from the substrate side, a MgO (001) layer, a layer containing a Group 4A metal, an oriented layer and a recording layer.

The present invention also provides a method for producing a structured material, comprising a first step of preparing a member having an MgO (001) layer, a second step of forming a layer containing a Group 4A metal on the MgO (001) layer, and a third step of forming an oriented layer composed by including a noble metal on the layer containing the Group 4A metal.

The present invention further provides a magnetic head capable of conducting magnetic recording on a magnetic recording medium including, on a substrate and from the side thereof, a MgO (001) layer, a layer containing a Group 4A metal, an oriented layer and a recording layer, and a magnetic recording/reproducing apparatus provided with a magnetic head drive section for driving such magnetic head.

BEST MODE FOR CARRYING OUT THE INVENTION

FIRST EMBODIMENT

Oriented Layer

Figure 1:
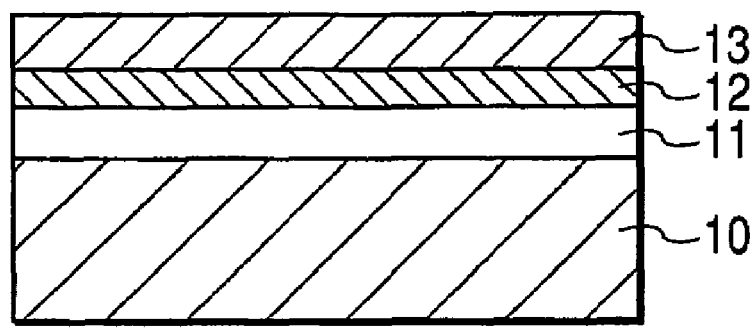
FIG. 1 is a schematic view showing an embodiment of a noble metal oriented layer of the present invention.

Now, an oriented layer of the present invention will be explained with reference to FIG. 1. FIG. 1 is a schematic view showing the configuration of a structured material of the present invention.

An oriented layer 13 of the invention, composed by including a noble metal, is characterized in that it is provided on a MgO (001) layer 11 through a Group 4A metal containing layer 12. Such oriented layer 13, MgO layer 11 and Group 4A metal containing layer 12 may be collectively called a multi-layered film, a multi-layered functional film or a multi-layered oriented film.

Referring to FIG. 1, there are shown a substrate 10, a MgO (001) layer 11, an orientation control layer (layer containing a Group 4A metal) 12, and an oriented layer 13 composed by including a noble metal.

The substrate 10 may be arranged under the MgO layer according to the necessity, and may be composed of any material such as glass that can withstand heating to about 250° C.

The MgO (001) layer 11 may be formed as a bulk member or a thin film. However, in case of a thin film, it is necessary to prepare a film having the (001) orientation for example by sputtering. In case of utilizing a bulk member, it is naturally possible to dispense with the aforementioned substrate.

The orientation control layer (Group 4A metal layer) 12 preferably has a thickness of 0.1 to 3.0 nm, particularly preferably 0.4 to 1.0 nm. Consequently, in case the orientation control layer (Group 4A metal layer) 12 is extremely thin, it may not be a complete film but can also be dispersed in an island shape or shaped as a pattern on the MgO (001) layer 11. Also in the orientation control layer (Group 4A metal layer) 12, it is possible to employ Ti, Zr, Hf or a combination thereof. In particular, Ti is preferred. Also it may be formed in a multi-layered configuration.

Also for the noble metal oriented layer 13, it is possible to use Pt, Pd, Ir, Rh, Ag or a combination thereof. In particular, Pt or Pd is effective. A film formation by sputtering on the aforementioned orientation control layer (Group 4A metal layer) 12 provides sufficient (001) orientation in case the temperature of the substrate is 250° C. or higher.

Thus, the oriented layer of the present invention is characterized in that it can be sufficiently oriented at a temperature lower than 600° C., for example at a heating temperature range of 300° C. or lower. Naturally an oriented state can be obtained also at a higher temperature range.

The degree of orientation of the noble metal oriented layer 13 is indicated by the intensity ratio of X-ray diffractions of Pt (002) and Pt (111). More specifically it is represented by:

$$\text{Orientation degree (\%)} = 100 \times F_{Pt}(002) / [F_{Pt}(002) + F_{Pt}(111)] \quad [1]$$

The degree of orientation of the noble metal oriented layer of the present invention is not particularly restricted as long as such oriented layer can be practically applied to a device utilizing such oriented layer, but it is preferred that the degree of orientation represented by the equation [1] is 99% or higher.

Also the noble metal oriented layer need not be composed singly of Pt, Pd, Ir, Rh or Ag, but may be formed by a mixture such as PtPd or may include other elements such as Ti, Zr, Hf etc. Also there may naturally be adopted a multi-layered configuration containing such noble metal.

SECOND EMBODIMENT

Example of Device Configuration (Configuration of Vertical Magnetic Recording Medium Utilizing Noble Metal Oriented Layer)

In the following an example of a vertical magnetic recording medium utilizing a noble metal oriented layer will be explained with reference to FIG. 2.

A soft magnetic layer, a protective layer and a lubricant layer are preferably applied when necessary, and there will be explained a configuration incorporating all these layers.

Figure 2:
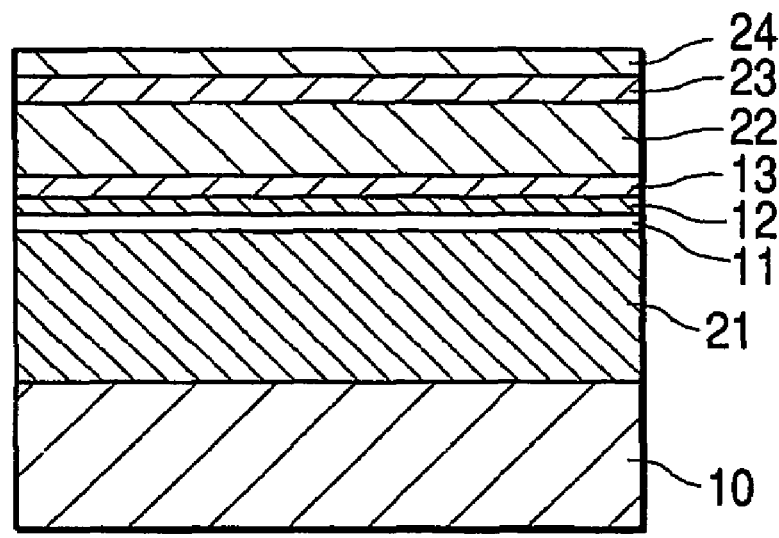
FIG. 2 is a schematic view showing a magnetic recording medium utilizing a noble metal oriented layer.

Referring to FIG. 2, there are shown a substrate 10, a soft magnetic layer 21, a MgO (001) layer 11, an orientation control layer (Group 4A metal layer) 12, a noble metal oriented film layer 13, a recording layer 22, a protective layer 23, and a lubricant layer 24.

As the substrate 10, there can be employed a flat substrate such as a glass substrate or an aluminum substrate for a hard disk. The soft magnetic layer 21 is required, in a vertical magnetic recording, in order to concentrate a magnetic field from a head to the recording layer 22. The layers 11 to 13 are utilized for attaining orientation of a hard magnetic material formed for example by $L1_0$:CoPt or $L1_0$:FePt of the recording layer 22. The protective layer 23 and the lubricant layer 24 are utilized for improving resistance to the friction and the abrasion between the head and the medium.

The soft magnetic layer 21 is preferably of a high magnetic permeability such as NiFe or FeCo, but, in consideration of noise generation resulting from magnetic wall displacement, there is preferred a material capable of separating a magnetic member thereby to fix the magnetic wall, such as FeTaC.

Also the recording layer 22 is preferably orientation controlled by the effect of the oriented film including the noble metal. Particularly in a production by an electroplating method, the effect of the oriented film including the noble metal is conspicuous. Also the recording layer 22 is preferably in a state in which a rod-shaped magnetic material of a diameter of 3 to 10 nm is uniformly dispersed in a non-magnetic material. In such situation, the magnetic material is preferably composed of a material of a high vertical magnetic anisotropy such as $L1_0$:CoPt, $L1_0$:FePt etc. However, as the magnetic material, there can also be conceived a multi-layered film of Co/Pt or Co/Pd in addition to $L1_0$:CoPt, $L1_0$:FePt etc., so that the foregoing examples are not restrictive but the high vertical magnetic anisotropy is an important factor. Also the manufacture is not limited to the electroplating method, and there can also be employed a film formation in vacuum such as a sputtering method.

For the protective layer 23, resistance to abrasion is important, and a diamond-like carbon is useful. Also the film thickness is preferably as thin as possible within such an extent as not to deteriorate the effect. Also the lubricant layer 24 is provided to attain smooth displacement between the head and the medium, and can be formed by applying a lubricant coat such as perfluoropolyether.

In the foregoing, there has been explained a vertical magnetic recording medium utilizing the oriented layer of the present invention, but a functional element or a functional device having such oriented layer can be a functional element (so-called ferroelectric memory) provided with a ferroelectric film (for example a ferroelectric film or a film of a high dielectric property having a perovskite structure or a layered structure such as of BT, PT, PZT or SBT) on such oriented layer.

EXAMPLES

Example 1

The present example employs Ti for the orientation control layer (Group 4A metal layer) and Pt and Pd as the noble metal, and shows an effect by incorporation of a Ti layer.

At first a MgO substrate was introduced in a sputtering apparatus, and the substrate was heated to 300° C. Argon was introduced from a basic pressure of $4.0 \times 10^{-5}$ Pa, and after a reverse sputtering for 120 seconds with an RF power of 150 W and a pressure of $7.0 \times 10^{-1}$ Pa, a Ti film was formed with a thickness of 4.5 Å and an RF power of 150 W. Subsequently a Pt, and Pd layers was formed with a thickness of 20 nm and an RF power of 300 W. On the other hand, there was also prepared a sample bearing a Pt and Pd layers prepared under the same conditions without forming the Ti layer. The Ti layer need not be a complete film, and the described film thickness is a value when converted into a film.

Four samples with combination of presence or absence of the Ti layer and Pt and Pd layers were subjected to X-ray diffraction measurement to calculate the degree of orientation of the Pt and Pd layers.

As a result, as shown in Table 1, either the Pt or Pd layer did not show the (002) diffraction in the absence of the Ti layer, and the degree of orientation represented by the equation [1]:

$$\text{degree of orientation [\%]} = 100 \times F(002) / [F(002) + F(111)]$$

was 0%. On the other hand, in the presence of the Ti layer, both layers had a high degree of orientation exceeding 99%.

TABLE 1

|  | Orientation (%) of Pt layer | Orientation (%) of Pd layer |
| --- | --- | --- |
| Ti layer present | 0% | 0% |
| Ti layer absent | 99.4% | 99.1% |

Example 2

This examples shows how an orientation of a noble metal, particularly Pt, is possible at low temperatures.

A MgO substrate was introduced in a sputtering apparatus, and the substrate was heated with four temperature conditions of room temperature, 200° C., 250° C. and 300° C. At each temperature, as in Example 1, argon was introduced from a back pressure of $4.0 \times 10^{-5}$ Pa, and, after a reverse sputtering for 120 seconds with an RF power of 150 W and a pressure of $7.0 \times 10^{-1}$ Pa, a Ti film was formed with a thickness of 4.5 Å and an RF power of 150 W. Subsequently a Pt layer was formed with a thickness of 20 nm and an RF power of 300 W.

An X-ray diffraction measurement was conducted in order to confirm whether these films were oriented.

As a result, as shown in Table 2, the degree of orientation (%) at each temperature was calculated by the equation [1]:

degree of orientation [%]=100×$F$(002)/[$F$(002)+$F$(111)].

TABLE 2

|  | room temp. | 200° C. | 250° C. | 300° C. |
|---|---|---|---|---|
| degree of orientation (%) | 0% | 29.1% | 99.3% | 99.4% |

From these results, it was confirmed that the degree of orientation changed significantly between 200° C. and 250° C., and that the orientation was 99% or higher at about 250° C. or higher. The above-mentioned temperature is a temperature of the substrate, but can be considered substantially equal to the temperature of the Group A4 metal layer.

Example 3

This example relates to a magnetic recording medium utilizing the aforementioned noble metal oriented film.

At first there was prepared a glass substrate for a hard disk, on which a soft magnetic layer was formed with a thickness of 300 nm and a MgO (001) layer was formed thereon with a thickness of 3 nm. Then a Ti layer of a thickness of 0.45 nm and a Pt layer of a thickness of 5 nm were formed under the sputtering conditions of the substrate temperature of 250° C. in Example 2, thereby obtaining a noble metal oriented film.

Figure 3A:
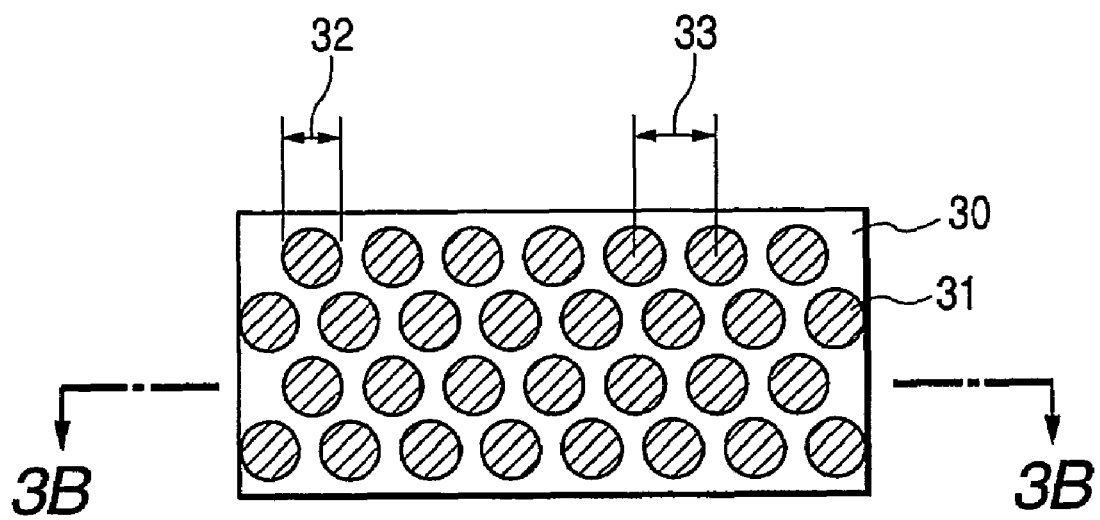
FIGS. 3A and 3B are schematic view of a recording layer.
Figure 3B:
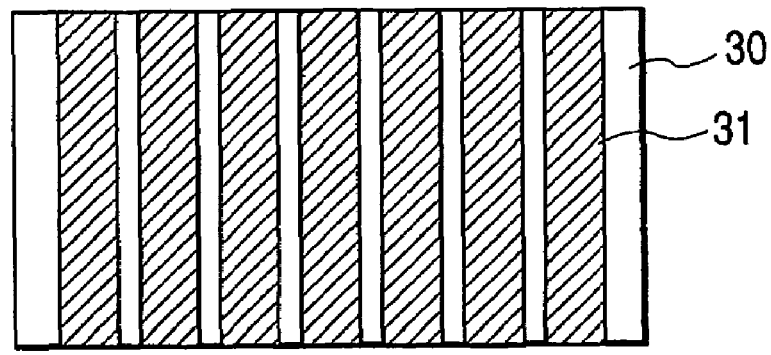

Also a film of a thickness of 25 nm, in which cylinders of $L1_0$:FePt dispersed in silicon oxide as shown in FIGS. 3A and 3B, was formed thereon as a recording layer, and a protective film of diamond-like carbon of a thickness of 3 nm and a lubricant layer of perfluoropolyether were applied. The cylinders of $L1_0$:FePt in the recording layer had a diameter of 5 to 6 nm. The recording layer was formed by a method of electroplating with FePt the silicon oxide film with fine pores of 5 to 6 nm utilizing Pt of the noble metal oriented film as an electrode layer, and then executing thermal treatment to obtain a finely dispersed cylinders of $L1_0$:FePt. In this method, because of the effect of the noble metal oriented film, the cylinders of $L1_0$:FePt were also oriented in the (001) direction.

A similar medium was also prepared utilizing a Pt layer of (111) orientation instead of the noble metal oriented film. In this case, the cylinders of $L1_0$:FePt were oriented in the (111) direction.

There were also prepared samples without the soft magnetic layer, respectively for Pt(001) and Pt(111).

At first, in a comparison of the samples having only the recording layer without the soft magnetic layer, the sample utilizing the noble metal oriented film of Pt (001) showed a high vertical magnetic anisotropy in the direction perpendicular to the substrate, with a squareness ratio of 0.95 in an M-H curve, but the sample utilizing the Pt (111) film showed a squareness ratio of about 0.5 in the M-H curve, both in the in-plate and in the vertical directions. It was therefore confirmed that the sample employing the noble metal oriented film of Pt (001) was usable as a vertical magnetic recording medium.

Also when the samples having the soft magnetic layer are subjected to recording by bringing it into contact with a magnetic head, vertical magnetic recording can be confirmed in the sample utilizing the noble metal oriented film of Pt (001) and having the vertical magnetic anisotropy by observation with a magnetic force microscope. It can therefore be confirmed that the vertical magnetic recording medium, utilizing the noble metal oriented film of Pt (001) etc. is effective.

However, the formation of the recording layer is not limited to the method explained in the foregoing, but can also be attained for example by sputtering a multi-layered film of Co/Pt or Co/Pd in an oriented state on a noble metal oriented film. It is also possible to form a granular film of $L1_0$:FePt or $L1_0$:CoPt.

Example 4

Figure 4:
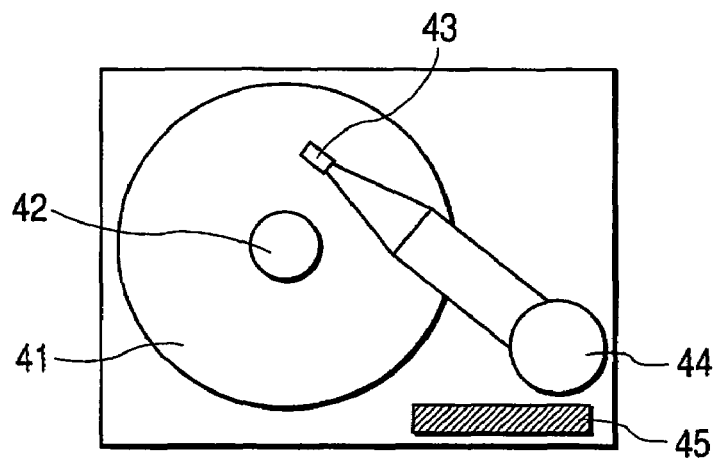
FIG. 4 is a conceptual view showing a magnetic recording/reproducing apparatus.
Figure 5:
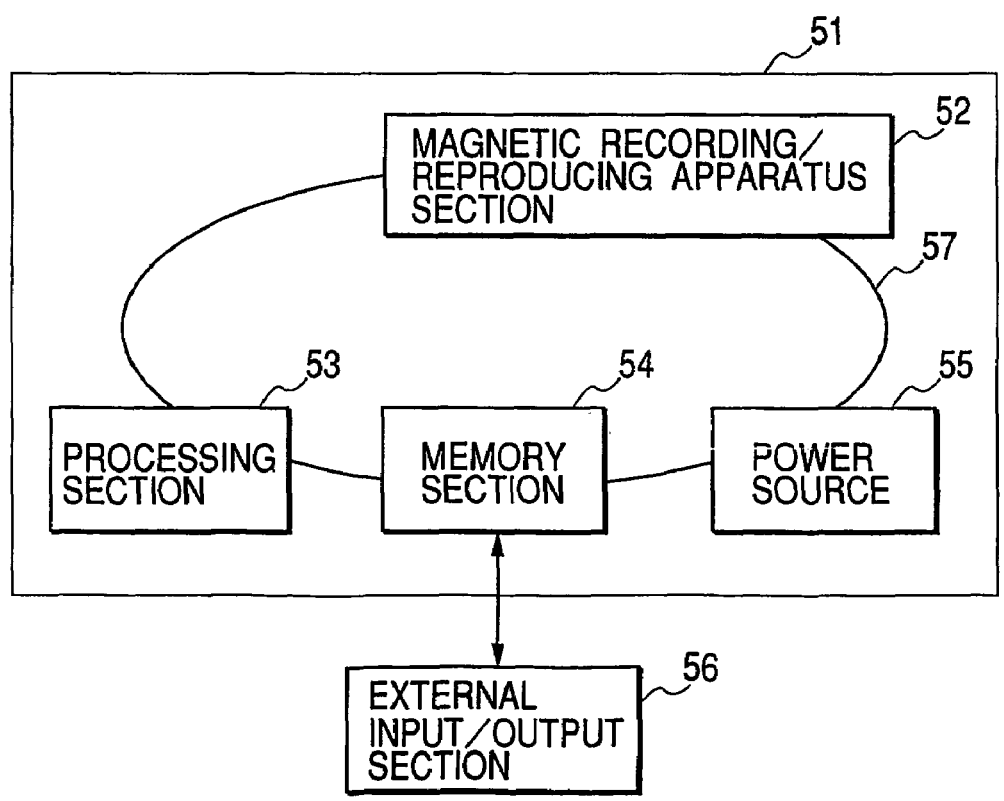
FIG. 5 is a conceptual view of an information processing apparatus.

This example provides a magnetic recording apparatus of a configuration as schematically shown in FIG. 4.

In the medium of the present invention, a magnetic material in the recording layer is oriented by the noble metal oriented film, and information can be recorded by the magnetizing direction of a plurality of cylindrical magnetic materials. Therefore, a magnetic recording apparatus can be constructed by incorporating the recording medium of the present invention in an apparatus including a magnetic medium driving section 42, a magnetic head 43, a magnetic head drive section 44 and a signal processing section 45. However, the present example does not limit the drive of the magnetic recording medium to a rotational motion only, nor the drive of the magnetic head to a circumferential sliding motion only.

Example 5

The present example relates to an information processing apparatus.

Since the magnetic recording/reproducing apparatus described in Example 4 is capable of information input and output, it is possible to construct an information processing apparatus including, within a casing 51, the aforementioned magnetic recording/reproducing apparatus section 52, a memory section 54, a processing section 53, an external input/output section 56, a power source 55 and connecting wirings 57. Also it is naturally possible to construct an information processing apparatus by externally (or internally) connecting the aforementioned magnetic recording/reproducing apparatus with a computer including a CPU.

The present invention allows to provide, in forming a noble metal oriented layer including a noble metal and having a (001) orientation, an oriented layer which can be formed at a low temperature less than 600° C. by providing a layer including a Group 4A metal.

The invention claimed is:

1. A structured material comprising in order: (a) an oriented layer containing a noble metal; (b) a layer containing a Group 4A metal; and (c) a MgO (001) layer, wherein said layer containing the Group 4A metal is dispersed in the shape of islands on said MgO (001) layer.

2. The structured material according to claim 1, wherein said layer containing the Group 4A metal has a thickness within a range of from 0.1 to 3.0 nm.

3. The structured material according to claim 1, wherein said noble metal is Pt, Pd, Ir, Rh, Ag or a combination thereof.

4. The structured material according to claim 1, wherein said layer containing the Group 4A metal is a Ti layer, a Zr layer, a Hf layer or a layer constituted of a combination of these metals.

* * * * *